United States Patent [19]
Sato et al.

[11] Patent Number: 5,700,625
[45] Date of Patent: Dec. 23, 1997

[54] NEGATIVE-WORKING PHOTORESIST COMPOSITION

[75] Inventors: Mitsuru Sato; Katsumi Oomori, both of Yokohama; Kiyoshi Ishikawa, Kanagawa-ken; Etsuko Iguchi, Machida; Fumitake Kaneko, Hiratsuka, all of Japan

[73] Assignee: Tokyo Ohka Kogyo Co., Ltd., Kawasaki, Japan

[21] Appl. No.: 630,621

[22] Filed: Apr. 10, 1996

[30] Foreign Application Priority Data

Apr. 19, 1995 [JP] Japan ................................ 7-093974

[51] Int. Cl.⁶ .................................................. G03F 7/038
[52] U.S. Cl. .................... 430/270.1; 430/176; 430/192
[58] Field of Search ...................... 430/270.1, 176, 430/192

[56] References Cited

U.S. PATENT DOCUMENTS

| | | | |
|---|---|---|---|
| 5,034,304 | 7/1991 | Feely | 430/270.1 |
| 5,204,225 | 4/1993 | Feely | 430/325 |
| 5,352,564 | 10/1994 | Takeda et al. | 430/270.1 |
| 5,514,520 | 5/1996 | Thackeray et al. | 430/270.14 |
| 5,541,263 | 7/1996 | Thackeray et al. | 525/328.8 |
| 5,547,812 | 8/1996 | Collins et al. | 430/270.1 |

FOREIGN PATENT DOCUMENTS

| | | |
|---|---|---|
| 0 488 748 | 6/1992 | European Pat. Off. . |
| 0 516 426 | 12/1992 | European Pat. Off. . |
| 0 516 427 | 12/1992 | European Pat. Off. . |
| 7-120924A2 | 5/1995 | Japan ............ 430/270.1 |

*Primary Examiner*—Cynthia Hamilton
*Attorney, Agent, or Firm*—Wenderoth, Lind & Ponack

[57] ABSTRACT

Disclosed is a novel chemical-sensitization type negative-working photoresist composition capable of exhibiting high sensitivity to actinic rays and giving a patterned resist layer with high resolution and excellently orthogonal cross sectional profile of the patterned resist layer without occurrence of microbridges. The composition comprises (a) a poly (hydroxystyrene)-based resin; (b) a compound capable of releasing an acid by the irradiation with actinic rays such as tris(2,3-dibromopropyl) isocyanurate; and (c) a crosslinking agent such as a urea resin and melamine resin, each in a specified weight proportion, the poly(hydroxystyrene)-based resin as the component (a) having such a dispersion of the molecular weight distribution that the ratio of the weight-average molecular weight $M_w$ to the number-average molecular weight $M_n$ does not exceed 1.4 and being substantially free from low molecular weight fractions including unpolymerized monomer and oligomers having a molecular weight smaller than 1000.

4 Claims, No Drawings

NEGATIVE-WORKING PHOTORESIST COMPOSITION

BACKGROUND OF THE INVENTION

The present invention relates to a novel negative-working photoresist composition or, more particularly, to a chemical-sensitization type negative-working photoresist composition having high sensitivity and capable of giving a patterned resist layer of high resolution without occurrence of microbridges.

As is known, the manufacturing process of various kinds of electronic parts such as semiconductor devices, liquid crystal display panels and the like involves a photolithographic patterning process in which a patterned resist layer is formed on the surface of a substrate by using a photoresist composition. The photoresist compositions currently under applications for such a purpose are classified into positive-working ones from which a positively patterned resist layer is obtained by the development treatment to dissolve away the resist layer in the areas exposed pattern-wise to actinic rays and negative-working ones from which a negatively patterned resist layer is obtained by the development treatment to dissolve away the resist layer in the areas unexposed to actinic rays in the pattern-wise exposure. As to the negative-working photoresist compositions, Japanese Patent Kokai 62-164045 discloses a chemical-sensitization type negative-working photoresist composition comprising an alkali-soluble resin, an acid-generating agent which releases an acid by the irradiation with actinic rays and a crosslinking agent.

In the above mentioned chemical-sensitization type negative-working photoresist composition, the pattern-wise image formation can be accomplished by utilizing the catalytic activity of the acid generated from the acid-generating compound by the irradiation with actinic rays so that the sensitivity is generally high and a patterned resist layer of high resolution can be obtained by the development treatment with an alkaline developer solution so that the photoresist compositions of this type are widely used in the preparation of semiconductor devices and liquid crystal display panels in which high fineness of patterning is essential. Along with the trend in recent years toward more and more compact design of various kinds of electronic instruments and higher and higher degrees of integration of semiconductor devices, photoresist compositions are also required to be imparted with further improved sensitivity and resolution of patterning.

To give a description on the chemical-sensitization type positive-working photoresist compositions utilizing the catalytic activity of an acid generated by the irradiation with actinic rays, on the other hand, some of the compositions of this class comprise a poly(hydroxystyrene), which is substituted for a part of the hydroxy groups by solubility-reducing groups capable of dissociation with an acid such as tert-butoxycarbonyl groups and the like, and an acid-generating agent which is a compound capable of releasing an acid by the irradiation with actinic rays. A preferable resinous ingredient in the photoresist composition of this type is a polymer having a low dispersion of the molecular weight distribution with a ratio of the weight-average molecular weight $M_w$ to the number-average molecular weight $M_n$ in the range from 1.0 to 1.4 as is disclosed in Japanese Patent Kokai 4-195138, 4-350657 and 4-350658. It is understood that the use of a poly(hydroxystyrene) resin having such a low dispersion of the molecular weight distribution is preferable not only in the positive-working photoresist compositions but also in the chemical-sensitization type negative-working photoresist compositions in respect of the generally excellent properties as a resist layer.

When such a low-dispersion polymeric resin is used in a negative-working photoresist composition, however, a trouble is sometimes caused in the patterned resist layer obtained by the development treatment due to the phenomenon of bridging between the patterned lines called a microbridge.

Further, conventional chemical-sensitization type negative-working photoresist compositions are not always quite satisfactory in respects of the sensitivity, which should be high enough in order to accomplish high productivity of the patterning process, and resolution of patterning, which should be high enough in order to accomplish a high degree of integration in the manufacture of semiconductor devices and liquid crystal display panels.

SUMMARY OF THE INVENTION

The present invention accordingly has an object, in view of the above described problems and disadvantages in the prior art due to the use of a low-dispersion poly (hydroxystyrene) resin, to provide a novel and improved chemical-sensitization type high-sensitivity negative-working photoresist composition capable of giving a patterned resist layer of high resolution without the disadvantageous phenomenon of microbridges.

Thus, the chemical-sensitization type negative-working photoresist composition provided by the present invention is a uniform blend which comprises:

(a) 100 parts by weight of a poly(hydroxystyrene)-based resin having a weight-average molecular weight in the range from 2000 to 25000 and having such a dispersion of the molecular weight distribution that the ratio of the weight-average molecular weight $M_w$ to the number-average molecular weight $M_n$ does not exceed 1.4;

(b) from 0.5 to 20 parts by weight of a compound capable of releasing an acid by the irradiation with actinic rays; and (c) from 3 to 70 parts by weight of a crosslinking agent, the poly(hydroxystyrene)-based resin as the component (a) being substantially free from unpolymerized monomer and oligomers having a molecular weight smaller than 1000.

DETAILED DESCRIPTION OF THE PREFERRED EMBODIMENTS

The component (a) as an alkali-soluble resin in the inventive photoresist composition is a film-forming agent which is preferably a poly(hydroxystyrene)-based polymeric resin having a weight-average molecular weight in the range from 2000 to 25000 and such a dispersion of the molecular weight distribution that the ratio of the weight-average molecular weight $M_w$ to the number-average molecular weight $M_n$, i.e. $M_w/M_n$, does not exceed 1.4. When the value of the dispersion is too large or, namely, the molecular weight distribution is too broad, degradation is caused in the properties of the patterned resist layer. When the weight-average molecular weight is too small, generation of microbridges cannot be suppressed while, when the weight-average molecular weight is too large, an adverse influence is caused on the resolution of patterning. Characteristically, the poly(hydroxystyrene)-based resin must be substantially free from unpolymerized monomer and oligomers having a molecular weight smaller than 1000. The oligomers falling within this limitation include the dimer to octamer when the poly(hydroxystyrene)-based resin is a homopolymer of a hydroxystyrene which has a molecular weight of 120.

The poly(hydroxystyrene)-based polymeric resin free from unpolymerized monomer and oligomers and suitable as the component (a) in the inventive photoresist composition can be prepared from a commercial product of a poly (hydroxystyrene)-based resin which is subjected to a fractionating treatment to remove low molecular weight fractions by a suitable fractionating method such as the fractionating solvent-extraction method utilizing the difference in the solubility of polymer molecules of different molecular weights in an organic solvent and the column chromatographic method. The former method of fractionating solvent-extraction method is preferred because the procedure is simple and removal of the low molecular fractions is efficient and reliable as compared with the latter method.

The fractionating solvent-extraction method is performed by dissolving the starting poly(hydroxystyrene)-based resin in a polar organic solvent such as ethyl lactate, N-methyl pyrrolidone, dimethyl acetamide, dimethyl formamide, methyl alcohol, ethyl alcohol and the like to prepare a solution into which an aliphatic non-polar hydrocarbon solvent such as n-pentane, n-hexane, n-heptane, n-octane, 2-methyl pentane and the like is admixed followed by thorough agitation of the mixture and standing thereof to effect phase separation into a solution in the polar solvent and a solution in the hydrocarbon solvent. The former solution in the polar organic solvent is taken and freed from the solvent by evaporation to give the polymeric resin or the solution is poured into a non-solvent of the polymer such as water to precipitate the polymer as the desired poly (hydroxystyrene)-based resin freed from the low molecular weight fractions.

The weight-average molecular weight of the poly (hydroxystyrene)-based resin thus obtained can be determined by the gel-permeation chromatographic (GPC) method making reference to polystyrene resins having known molecular weights. The dispersion or broadness of the molecular weight distribution is represented by the ratio of $M_w/M_n$ in which $M_w$ and $M_n$ are the weight-average and number-average molecular weights, respectively. The GPC method is also suitable for the confirmation of absence of unpolymerized monomer and oligomers in the resin.

The poly(hydroxystyrene)-based resin as the component (a) in the inventive photoresist composition includes homopolymeric poly(hydroxystyrene) resins and copolymeric resins of a hydroxystyrene and another ethylenically unsaturated monomeric compound or, in paticular, an other styrene monomer as a comonomer which is preferably a styrene compound such as styrene, α-methyl styrene, 4- and 2-methyl styrenes, 4-methoxy styrene, 4-chloro styrene and the like. These comonomer compounds can be used either singly or as a combination of two kinds or more according to need. When the poly(hydroxystyrene)-based resin is such a copolymer, at least 70% by moles of the monomeric units must be the hydroxystyrene units. It is also suitable to use a combination of a poly-(hydroxystyrene) and a polymer of these comonomer compounds as the component (a) provided that the molar fraction of the hydroxystyrene moiety is at least 70% or a poly(hydroxystyrene)-based resin which is substituted for a part of the hydroxy groups by alkali-solubility reducing groups capable of being decomposed in the presence of an acid.

The above mentioned alkali-solubility reducing group is exemplified by tert-butyl, tert-butoxycarbonyl, tert-amyloxycarbonyl, 1-ethoxyethyl, 1-methoxypropyl, tetrahydro-pyranyl, tetrahydrofuranyl, benzyl and trimethylsilyl groups though not particularly limitative thereto, of which tert-butoxycarbonyl group is preferred in respect of the good balance between the acid-decomposability and the alkali solubility-reducing power and the excellent cross sectional profile of the patterned resist layer formulated with such a poly(hydroxystyrene) resin as the component (a). The degree of substitution of the poly(hydroxystyrene) resin by these alkali solubility reducing groups is in the range from 1 to 45% or, preferably, from 5 to 15% of the hydroxy groups in the starting poly(hydroxystyrene) resin. When the degree of substitution is too high, the alkali-solubility of the resin is unduly decreased so that difficulties are encountered in the pattern formation by the development treatment with an alkaline developer solution due to incomplete removal of the resist layer in the unexposed areas.

Further, the poly(hydroxystyrene)-based resin as the component (a) can be substituted for a part of the hydroxy groups by benzene sulfonyl groups, 4-acetaminobenzene sulfonyl groups, 4-chlorobenzene sulfonyl groups, naphthylbenzene sulfonyl groups, benzene carbonyl groups, 4-acetaminobenzene carbonyl groups, 4-chlorobenzene carbonyl groups, naphthylbenzene carbonyl groups and the like so as to convert the hydroxy groups into sulfonate ester groups or carboxylate ester groups. The degree of substitution of the poly(hydroxystyrene) resin by these groups is in the range from 0.5 to 50% or, preferably, from 10 to 30% of the hydroxy groups in the starting poly(hydroxystyrene) resin. When the degree of substitution is too high, the alkali-solubility of the resin is unduly decreased so that difficulties are encountered in the pattern formation in the development treatment due to incomplete removal of the resist layer in the unexposed areas.

The component (b) in the inventive photoresist composition is a compound capable of releasing an acid by the irradiation with actinic rays, which can be any of the compounds used in conventional chemical-sensitization type negative-working photoresist compositions.

Examples of the compound suitable as the acid-generating agent in the inventive composition include: bis(sulfonyl) diazomethane compounds such as bis(p-toluenesulfonyl) diazomethane, bis(1,1-dimethylethylsulfonyl) diazomethane, bis(cyclohexylsulfonyl) diazomethane, bis(2, 4-dimethylphenylsulfonyl) diazomethane and the like; nitrobenzyl compounds such as 2-nitrobenzyl p-toluene sulfonate, 2,6-dinitrobenzyl p-toluene sulfonate and the like; sulfonate ester compounds such as pyrogallol trimesylate, pyrogallol tritosylate and the like; onium salts such as diphenyliodonium hexafluoro phosphate, (4-methoxyphenyl)phenyliodonium trifluoromethane sulfonate, bis(p-tert-butylphenyl)iodonium trifluoromethane sulfonate, triphenylsulfonium hexafluoro phosphate, (4-methoxyphenyl) diphenylsulfonium trifluoromethane sulfonate, (p-tert-butylphenyl)diphenylsulfonium trifluoromethane sulufonate and the like; benzoin tosylate compounds such as benzoin tosylate, α-methylbenzoin tosylate and the like; and halogen-containing triazine compounds such as 2-(4-methoxyphenyl)-4,6-bis (trichloromethyl)-1,3, 5-triazine, 2-(4-methoxynaphthyl)-4,6-bis( trichloromethyl) -1,3,5-triazine, 2-[2-(2-furyl)ethenyl ]-4,6- bis (trichloromethyl)-1,3,5- triazine, 2-[2-(5-methyl-2-furyl) ethenyl]-4,6-bis(trichloromethyl)-1,3,5-triazine, 2-[2-(3,5-dimethoxyphenyl)ethenyl]-4,6-bis(trichloromethyl)-1,3, 5-triazine, 2-[2 -(3,4-dimethoxyphenyl) ethenyl]-4,6-bis (trichloromethyl)-1,3,5-triazine, 2-(3,4-methylenedioxyphenyl)-4,6-bis(trichloromethyl)-1,3,5- triazine, 2,4,6-tris(1,3-dibromopropyl)-1,3,5-triazine, 2,4,6-tris(2,3-dibromopropyl)-1,3,5-triazine, tris(2,3-dibromopropyl) isocyanurate and the like, of which halogen-containing triazine compounds are preferred and tris(2,3-dibromopropyl) isocyanurate is more preferable in respect of the high sensitivity of the composition formulated therewith. These compounds can be used either singly or as a combination of two kinds or more according to need.

The component (c) in the inventive photoresist composition serves as a crosslinking agent and can be selected from amino resins having hydroxy groups or alkoxy groups, benzene compounds having alkoxy groups and phenol compounds having non-phenolic hydroxy groups or alkoxy groups. The amino resins to be substituted by hydroxy or alkoxy groups includes melamine resins, urea resins, guanamine resins, glycoluryl-formaldehyde resins, succinamide-formaldehyde resins, ethyleneurea-formaldehyde resins and the like. These amino resins can be easily prepared by the reaction of formaldehyde in boiling water with, respectively, melamine, urea, guanamine, glycoluryl, succinamide or ethyleneurea to effect methylolation followed, if necessary, by alkoxylation by the reaction with a lower alcohol. These amino resins are available as a commercial product sold under the tradenames of, for example, Nikalac Mx-750, Nikalac Mw-30, Nikalac Mx-290 (each a product by Sanwa Chemical Co.) and the like and can be used as such.

The benzene compound having alkoxy groups is exemplified by 1,3,5-tris(methoxymethoxy) benzene, 1,2,4-tris(isopropoxymethoxy) benzene, 1,4-bis(sec-butoxymethoxy) benzene and the like and the phenol compound having non-phenolic hydroxy or alkoxy groups is exemplified by 2,6-dihydroxymethyl-pcresol, 2,6-dihydroxymethyl-p-tert-butyl phenol and the like.

These compounds as the crosslinking agent can be used either singly or as a combination of two kinds or more according to need. Among the above named compounds, those derived from urea resins and melamine resins are preferable in respect of the excellent resolution exhibited by the photoresist composition formulated therewith. In particular, it is more preferable that the component (c) is a combination of a urea resin and a melamine resin in a weight proportion in the range from 80:20 to 99:1.

The amounts of the components (b) and (c) in the inventive photoresist composition are selected each in a specified range based on the amount of the component (a). For example, the amount of the component (b) is in the range from 0.5 to 20 parts by weight and the amount of the component (c) is in the range from 3 to 70 parts by weight each per 100 parts by weight of the component (a). When the amount of the component (b) is too small, the photoresist composition cannot be imparted with a high sensitivity while, when the amount thereof is too large, a decrease is caused in the uniformity of the photoresist composition. When the amount of the component (c) is too small, the photoresist composition cannot be imparted with good pattern-formability while, when the amount thereof is too large, a decrease is caused in the developability of the photoresist composition.

It is of course optional that the inventive photoresist composition is admixed according to need, in addition to the above described essential ingredients, with various kinds of additives having compatibility therewith including auxiliary resins, plasticizers, stabilizers and surface active agents to improve the properties of the resist layer, coloring agents to increase the visibility of the patterned resist layer obtained by the development treatment, sensitizing agents to increase the sensitivity of the photoresist composition to actinic rays, dyes to serve as a halation inhibitor and so on.

The inventive photoresist composition is used advantageously in the form of a solution prepared by dissolving the above described essential and optional ingredients in a suitable organic solvent. Examples of suitable organic solvents include ketone compounds such as acetone, methyl ethyl ketone, cyclohexanone, isobutyl methyl ketone, isoamyl methyl ketone, 2-heptanone, 1,1,1-trimethylacetone and the like; polyhydric alcohols and derivatives thereof such as ethylene glycol, propylene glycol and diethylene glycol as well as monoacetates thereof and monoacetate monoethers thereof, e.g., monomethyl, monoethyl, monopropyl, monoisopropyl, monobutyl and monophenyl ethers of monoacetates, and the like; cyclic ethers such as dioxane and the like; esters such as methyl acetate, ethyl acetate, butyl acetate, methyl lactate, ethyl lactate, methyl pyruvate, ethyl pyruvate, ethyl 3-ethoxypropionate and the like. These organic solvents can be used either singly or as a mixture of two kinds or more according to need.

Following is a description of the procedure for the fine patterning work by using the above described negative-working photoresist composition of the invention. Thus, a substrate such as a semiconductor single crystal silicon wafer is coated with the photoresist composition in the form of a solution by using a suitable coating machine such as a spinner followed by drying to form a photoresist layer having sensitivity to actinic rays and the resist layer is exposed pattern-wise to actinic rays such as g-line ultraviolet, i-line ultraviolet, deep ultraviolet, excimer laser beams and X-rays or irradiated with an electron beam scanned along a desired pattern to form a latent image in the resist layer which is developed in a development treatment by using an aqueous alkaline solution containing an organic alkaline compound such as tetramethyl ammonium hydroxide or choline in a concentration of 2 to 10% by weight as a developer solution. The resist layer is dissolved away selectively by this developer solution in the areas unexposed to actinic rays leaving a patterned resist layer in the pattern-wise exposed areas having an excellently orthogonal cross sectional profile. Characteristically, the thus obtained finely patterned resist layer is free from the troubles due to formation of microbridges along with the advantages of high resolution of patterning and high sensitivity to the actinic rays so that the inventive photoresist composition is useful for the fine patterning work in the manufacture of various kinds of semiconductor devices, liquid crystal display panels and the like.

In the following, the negative-working photoresist composition of the invention is described in more detail by way of examples, which, however, never limit the scope of the invention in any way, as preceded by the description for the preparation of a poly(hydroxystyrene) resin suitable as the component (a) in the inventive composition.

PREPARATION EXAMPLE

A solution prepared by dissolving 10.0 g of a poly(hydroxystyrene) resin having a weight-average molecular weight of 20000 with a dispersion of the molecular weight distribution $M_w/M_n$ of 1.1 (VP-20000, a product by Nippon Soda Co.), which contained a few % by weight or less of unpolymerized monomer and oligomers having a molecular weight smaller than 1000, in 40 g of ethyl lactate was taken in a separatory funnel and admixed with 150 g of n-hexane and the mixture was thoroughly shaken followed by standing to effect phase separation into an upper layer of the n-hexane solution and lower layer of the ethyl lactate solution. The n-hexane solution as the upper layer was discarded and the ethyl lactate solution as the lower layer was again admixed with 150 g of n-hexane followed by vigorous shaking of the mixture. This fractionating extraction with n-hexane was repeatedly undertaken four times and the finally obtained ethyl lactate solution was subjected to replacement of solvent with methyl alcohol by repeating evaporation of ethyl lactate and addition of methyl alcohol. The thus obtained methyl alcohol solution was added dropwise into a large volume of water to effect precipitation of the polymer which was collected, washed with pure water and dried to give a poly(hydroxystyrene) resin substantially free from unpolymerized hydroxystyrene monomer and oligomers having a molecular weight smaller than 1000 as confirmed by the GPC method. Since the content of the low molecular weight fractions in the starting resin was relatively low, no significant changes were found in the weight-average molecular weight and in the dispersion of the molecular weight distribution.

EXAMPLE 1

A negative-working photoresist solution was prepared by dissolving 2.0 g of the poly(hydroxystyrene) resin obtained in the above described manner and 0.5 g of a urea resin (Mx-290, a product by Sanwa Chemical Co.) in 14 g of ethyl lactate followed by further addition of 0.2 g of tris(2,3-dibromopropyl) isocyanurate.

A 6-inch semiconductor silicon wafer after a surface treatment by keeping for 7 minutes in an atmosphere of hexamethyl disilazane vapor was uniformly coated with the above prepared photoresist solution on a spinner rotating at 3000 rpm for 30 seconds followed by drying on a hot plate at 100° C. for 90 seconds to form a resist layer having a thickness of 0.7 μm. The resist layer was irradiated pattern-wise with an excimer laser beam on a minifying projection exposure machine (Model NSR-2005EX8A, manufactured by Nikon Co.) through a line-and-space photomask followed by a post-exposure baking treatment at 130° C. for 90 seconds and development with an aqueous developer solution containing 2.38% by weight of tetramethyl ammonium hydroxide at 23° C. for 65 seconds in a puddle-type development machine to give a patterned resist layer.

The resolution in the thus formed patterned resist layer was so fine that good resolution was obtained for a line-and-space pattern of 0.28 μm line width. The patterned resist layer had an excellently orthogonal cross sectional profile standing upright on the substrate surface without occurrence of microbridges. The minimum exposure dose for patterning representing the sensitivity of the photoresist composition was 50 mJ/cm².

EXAMPLE 2

The formulation of the photoresist solution and the procedure for the preparation of a patterned resist layer were substantially the same as in Example 1 excepting an increase of the amount of the poly(hydroxystyrene) resin from 2.0 g to 2.25 g, a decrease of the amount of the urea resin from 0.5 g to 0.225 g and additional addition of 0.008 g of a melamine resin (Mx-750, a product by Sanwa Chemical Co.).

The resolution in the thus formed patterned resist layer was so fine that good resolution was obtained for a line-and-space pattern of 0.24 μm line width. The patterned resist layer had an excellently orthogonal cross sectional profile standing upright on the substrate surface without occurrence of microbridges. The minimum exposure dose for patterning representing the sensitivity of the photoresist composition was 30 mJ/cm².

COMPARATIVE EXAMPLE

The formulation of the photoresist solution and the procedure for the preparation of a patterned resist layer were substantially the same as in Example 1 excepting replacement of the poly(hydroxystyrene) resin freed from the low molecular weight fractions with the same amount of the commercially available poly(hydroxystyrene) resin (VP-20000) as such, in which the content of low molecular weight fractions having a molecular weight of 1000 or smaller was 2% by weight.

The resolution in the thus formed patterned resist layer was so fine that good resolution was obtained for a line-and-space pattern of 0.28 μm line width. The patterned resist layer had an orthogonal cross sectional profile standing upright on the substrate surface but occurrence of microbridges was detected. The minimum exposure dose for patterning representing the sensitivity of the photoresist composition was 50 mJ/cm².

What is claimed is:

1. A chemical-sensitization negative-working photoresist composition which comprises, as a uniform blend:

(a) 100 parts by weight of a resin selected from the group consisting of a poly(hydroxystyrene) resin, a copolymeric resin of a hydroxystyrene monomer and a comonomer selected from the group consisting of styrene, β-methylstyrene, 4-methylstyrene, 2-methylstyrene, 4-methoxystyrene and 4-chlorostyrene, wherein the molar fraction of hydroxystyrene units in said copolymeric resin is at least 70% and combinations of said poly (hydroxystyrene) resin and said copolymeric resin, said resins having a weight-average molecular weight in the range from 2,000 to 25,000 and having such a dispersion of the molecular weight distribution that the ratio of the weight-average molecular weight $M_w$ to the number-average molecular weight $M_n$ does not exceed 1.4;

(b) from 0.5 to 20 parts by weight of a compound capable of releasing an acid by irradiation with actinic rays; and (c) from 3 to 70 parts by weight of a crosslinking agent, the resin as the component (a) being substantially free from unpolymerized monomers and oligomers having a molecular weight smaller than 1,000.

2. The chemical-sensitization negative-working photoresist composition as claimed in claim 1 in which the compound capable of releasing an acid by the irradiation with actinic rays as the component (b) is tris(2,3-dibromopropyl) isocyanurate.

3. The chemical-sensitization negative-working photoresist composition as claimed in claim 1 in which the crosslinking agent as the component (c) is a urea resin, a melamine resin or a combination thereof.

4. The chemical-sensitization negative-working photoresist composition as claimed in claim 3 in which the crosslinking agent as the component (c) is a combination of a urea resin and a melamine resin in a weight ratio in the range from 80:20 to 99:1.

* * * * *

UNITED STATES PATENT AND TRADEMARK OFFICE
CERTIFICATE OF CORRECTION

PATENT NO. : 5,700,625
DATED : December 23, 1997
INVENTOR(S) : Mitsuru SATO et al.

It is certified that error appears in the above-identified patent and that said Letters Patent is hereby corrected as shown below:

Claim 1, line 7, change "$\beta$-methylstyrene" to --$\alpha$-methylstyrene--.

Signed and Sealed this

Seventh Day of April, 1998

Attest:

BRUCE LEHMAN

Attesting Officer

Commissioner of Patents and Trademarks